(12) United States Patent
Sakurai et al.

(10) Patent No.: US 7,291,517 B2
(45) Date of Patent: Nov. 6, 2007

(54) METHOD FOR REMOVING RESIN MASK LAYER AND METHOD FOR MANUFACTURING SOLDER BUMPED SUBSTRATE

(75) Inventors: Hitoshi Sakurai, Kakogawa (JP); Kimihiro Abe, Fuji (JP); Norio Matsumoto, Atsugi (JP)

(73) Assignee: Harima Chemicals, Inc., Hyogo (JP)

( * ) Notice: Subject to any disclaimer, the term of this patent is extended or adjusted under 35 U.S.C. 154(b) by 0 days.

(21) Appl. No.: 11/248,183

(22) Filed: Oct. 13, 2005

(65) Prior Publication Data

US 2006/0110907 A1    May 25, 2006

(30) Foreign Application Priority Data

Oct. 15, 2004   (JP) .............................. 2004-301270

(51) Int. Cl.
*H01L 21/00* (2006.01)
(52) U.S. Cl. ........................ 438/106; 216/49; 438/758; 361/720
(58) Field of Classification Search ................ 438/106, 438/758; 216/40, 41, 42, 43, 49; 361/719, 361/720
See application file for complete search history.

(56) References Cited

U.S. PATENT DOCUMENTS

| 6,524,943 | B1 | 2/2003 | Sakuyama |
| 7,087,563 | B2* | 8/2006 | Iwamoto et al. ............. 510/175 |
| 2004/0209451 | A1* | 10/2004 | Kukimoto et al. .......... 438/612 |

FOREIGN PATENT DOCUMENTS

| JP | 6-250403 A | 9/1994 |
| JP | 7-288372 A | 10/1995 |
| JP | 2002-334895 | 11/2002 |
| JP | 2005-274792 | 6/2005 |

* cited by examiner

*Primary Examiner*—W. David Coleman
(74) *Attorney, Agent, or Firm*—Sughrue Mion Pllc.

(57) ABSTRACT

Using a dry film resist that is a photosensitive resin, a resin mask layer is formed around electrodes on a substrate. A solder precipitating composition is applied on the substrate, and this solder precipitating composition is heated to precipitate solder on the surface of the electrodes. Subsequently, in removing the resin mask layer, at least one selected from glycol ethers and aminoalcohols is used. Thereby, the resin mask layer is removed after heating process. This makes it possible to easily remove the heat-processed resin mask layer in a short period of time without damaging solder resist and solder bumps on the substrate.

14 Claims, 1 Drawing Sheet

METHOD FOR REMOVING RESIN MASK LAYER AND METHOD FOR MANUFACTURING SOLDER BUMPED SUBSTRATE

Priority is claimed to Japanese Patent Application No. 2004-301270 filed on Oct. 15, 2004, the disclosure of which is incorporated by reference in its entirety.

BACKGROUND OF THE INVENTION

1. Field of the Invention

The present invention relates to a method for removing a resin mask layer and a method for manufacturing a solder bumped substrate, when solder and in particular solder bumps are formed through resin mask method in surface mounting of electronic parts on electronic circuit substrates, using a solder precipitating composition.

2. Description of Related Art

In recent years, as electronic devices have smaller size and lighter weight, electronic parts have more pins and narrower pitch. Conductor patterns as well have a larger number of conductors formed at very small intervals in a narrow range, which means that fine pitch becomes widespread. This is why mounting method using solder bumps is widely employed to bond electronic parts to electronic circuit substrates, instead of conventional wire bonding. Via-on-pad structure where via holes are prepared on pads in a substrate is also widely employed in terms of wiring design.

As for solder bump forming method, normally employed is resin mask method using a solder paste that is a mixture of solder powder and flux. That is, through conventional resin mask method, a resin film is formed on a substrate having electrodes, and opening parts to expose electrode parts are formed by development process. Then, a solder paste fills the opening parts, and heating process is performed to melt the solder paste, thereby forming solder bumps. Lastly, a resin mask layer is removed.

Through the above resin mask method, however, since heating process (normally at 200° C. or higher) is performed to form solder bumps, resulting in a resin mask layer that is more resistant to separation, it is difficult to completely remove the resin mask layer. Meanwhile, the residue of a resin mask layer on a substrate might have negative effects on subsequent electronic packaging.

As a resist stripping agent, a strong alkaline solution is generally used. However, a substrate soaked in such a strong alkaline solution has a possibility to damage solder resist and solder bumps on a substrate. This might cause a problem with reliability of solder connection.

Regarding a method for removing a resin mask layer, Japanese Unexamined Patent Publication No. 7-288372 discloses the use of an organic alkali aqueous solution, especially monoethanolamine as a stripping agent for alkali-soluble resist. Japanese Unexamined Patent Publication No. 6-250403 discloses that a strong alkaline aqueous solution including triethanolamine is used as a stripping agent for plating resist that is formed on a substrate by water-soluble resist. As for resist separation disclosed in these publications, however, heating process at a high temperature is not performed before separation process. Therefore, resist separation is considered relatively easy.

SUMMARY OF THE INVENTION

The advantage of the present invention is to provide a method for removing a resin mask layer that enables a heat-processed resin mask layer to be easily removed in a short period of time without damaging solder resist and solder on a substrate, and a method for manufacturing a circuit substrate.

The present inventors have earnestly worked on research to solve the above-mentioned problem and found the new fact as follows: in forming solder on electrodes through resin mask method, if glycol ethers or aminoalcohols are used to remove a heat-processed resin mask layer, a resin mask layer that has become resistant to separation after heating process can be easily removed in a short period of time, causing less damage to solder resist and solder bumps on a substrate; and this makes it possible to improve reliability of solder connection.

The method for removing a resin mask layer in the present invention includes the step of forming a resin mask layer around electrodes that are exposed from opening parts of an insulation layer formed on a substrate surface, by using a dry film resist; the step of applying a solder precipitating composition on the substrate, the step of precipitating solder on the surface of the electrodes while heating this solder precipitating composition, and the step of removing the resin mask layer. At least one selected from glycol ethers and aminoalcohols is used to remove the resin mask layer after heating process.

Further, the method for manufacturing a solder bumped substrate in the present invention includes the step of forming a resin mask layer around electrodes on a substrate surface by using a dry film resist, the step of applying a solder precipitating composition on the substrate, the step of precipitating solder bumps on the surface of the electrodes while heating this solder precipitating composition, and the step of removing the resin mask layer after heating process by using at least one selected from glycol ethers and aminoalcohols.

The present invention is especially effective when the above heating process is performed at a temperature of 200° C. or higher. Moreover, when at least one of the insulation layers on a substrate has higher glass transition point than a temperature at which the heating process is performed, it is also especially effective because substrate shape is stabilized during heating process.

According to the present invention, when solder is precipitated on electrodes through resin mask method, the effects are as follows: a resin mask can be easily formed in a smaller number of processes; a heat-processed resin mask layer can be easily removed in a short period of time; less damage is caused to solder resist and solder on a substrate; and therefore reliability of solder connection can be improved.

Other objectives and advantages of the present invention will be clarified in the following description.

DETAILED DESCRIPTION OF PREFERRED EMBODIMENTS

Figure 1:
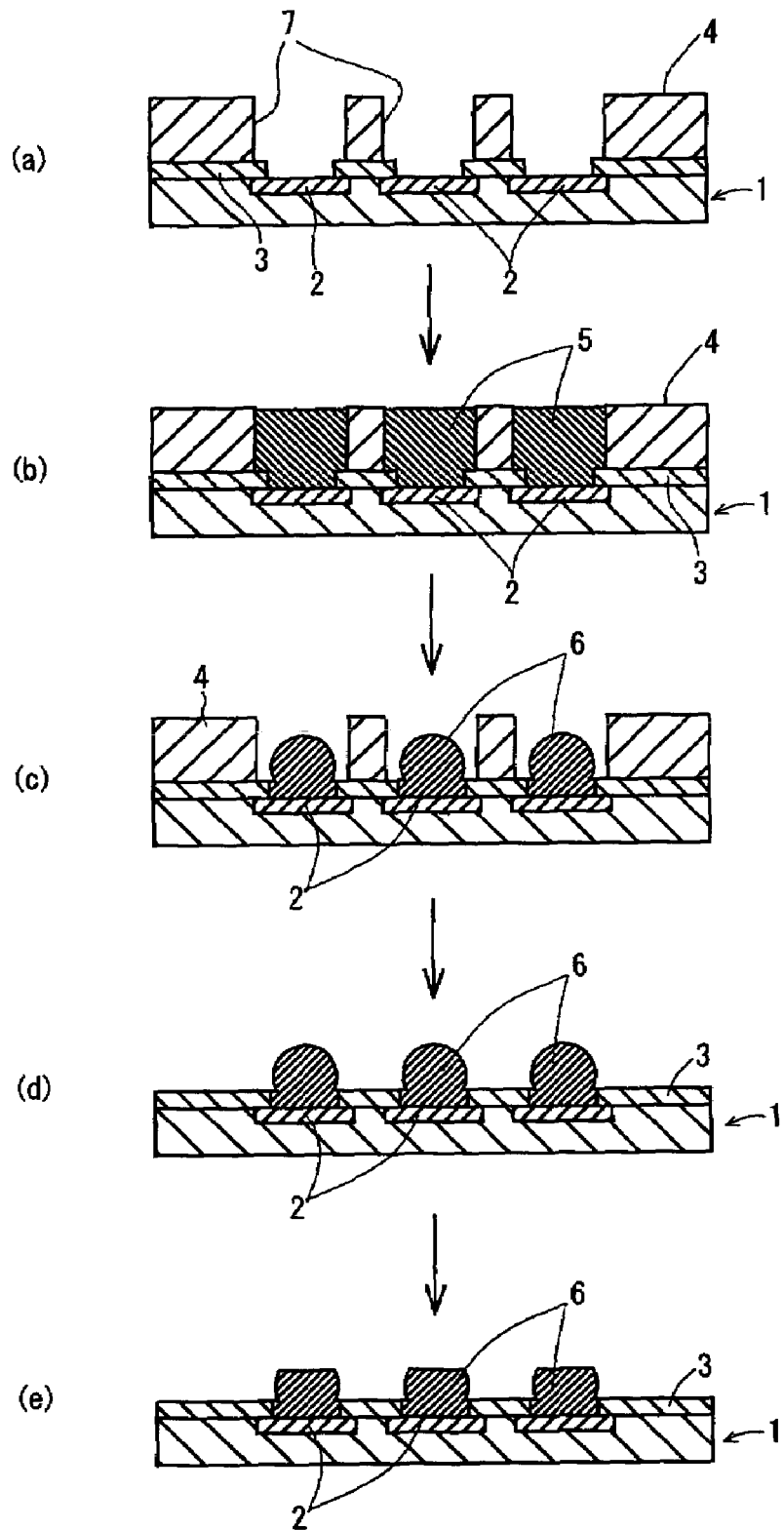
FIG. 1(*a*) to (*e*) are schematic diagrams showing one embodiment according to the method of the present invention.

The present invention will be now described, referring to the drawings. FIG. 1(a) to (e) are schematic diagrams showing the method for removing a resin mask layer according to one embodiment of the present invention. As shown in FIG. 1(a), a solder resist film 3 (insulation layer) is formed on the surface of a substrate 1, and electrodes 2 are exposed from opening parts formed in this solder resist film 3. A resin mask layer 4 (that is, dams) is formed in some part other than electrodes 2 on the surface of this substrate 1. Next, as shown in FIG. 1(b), a solder precipitating composition 5 is applied on the surface of the substrate 1, and heating is performed. As shown in FIG. 1(c), solder is precipitated on the surface of the electrodes 2 to form solder bumps 6. Then, as shown in FIG. 1(d), the resin mask layer 4 is removed, and if necessary, flattening is carried out as shown in FIG. 1(e).

The electrodes 2 are exposed at predetermined pitches on the substrate 1. Epoxy resin, acryl resin and polyamide resin may be used for a solder resist film 3, and preferable may be epoxy resin.

As a resin material to form a resin mask layer 4, a film-like photosensitive resin is preferably used in terms of forming thick films evenly, and a dry film resist is more preferably used. In order to form bumps with precipitated solder, it is desirable in terms of precipitated solder amount to use a dry film resist having a photosensitive resin layer that is not less than 10 µm thick, preferably, not less than 30 µm thick. The photosensitive resin layer has thickness of not more than 300 µm, preferably not more than 150 µm. If it has thickness of over 300 µm, it may become difficult to harden the photosensitive resin layer to the bottom.

"Dry film resist" stands for a photosensitive resin laminated body made of three layers, that is, a carrier film, a photosensitive resin layer that is laminated on the carrier film, and a cover film that is provided on the surface of this photosensitive resin layer (i.e. the surface opposite to the carrier film).

It is preferable that a dry film resist used in the present invention, as a photosensitive resin layer, has photosensitive resin with a specific compounding ratio.

A photosensitive resin preferably used in the present invention will be described below.

It is preferable that the photosensitive resin in the present invention contains (A1) 15 to 35% by weight of alkali-soluble polymer having a carboxyl group and having weight-average molecular weight of 40,000 to 90,000, (A2) 15 to 35% by weight of alkali-soluble polymer having a carboxyl group and having weight-average molecular weight of 100,000 to 150,000, (B) 15 to 60% by weight of addition polymerizable monomer, (C) 0.01 to 10% by weight of photopolymerization initiator, and (D) 7 to 30% by weight of polypropylene oxide having weight-average molecular weight of 1,000 to 3,000.

Alkali-soluble polymer as component (A1) and (A2) is preferably vinyl copolymer in terms of flexibility, and further preferably vinyl copolymer containing carboxyl group in terms of development. Vinyl copolymer containing carboxyl group herein is a compound obtained as a vinyl copolymer of the first monomer that is at least one selected from α,β-unsaturated carboxylic acids and the second monomer that is at least one selected from alkyl (meth) acrylate, hydroxyalkyl (meth)acrylate, (meth)acrylamide, a compound obtained by replacing hydrogen on its nitrogen with alkyl group or alkoxy group, styrene, styrene derivatives, (meth)acrylonitrile and glycidyl (meth)acrylate. "(Meth)acrylate" means methacrylate or acrylate.

Examples of the first monomer used in the vinyl copolymer containing carboxyl group include acrylic acid, methacrylic acid, fumaric acid, cinnamic acid, crotonic acid, itaconic acid and monoester maleate, each of which can be used alone or a combination of two or more of which can be used.

The percentage of the first monomer in the vinyl copolymer containing carboxyl group is preferably 15 to 40% by weight and more preferably 20 to 35% by weight. The percentage of the first monomer is preferably not less than 15% by weight to keep alkali developing property, and preferably not more than 40% by weight in terms of solubility of vinyl copolymer containing carboxyl group.

Examples of the second monomer used in the vinyl copolymer containing carboxyl group include methyl(meth) acrylate, ethyl(meth)acrylate, n-propyl(meth)acrylate, cyclohexyl(meth)acrylate, n-butyl(meth)acrylate, 2-ethylhexyl(meth)acrylate, 2-hydroxyethyl(meth)acrylate, 2-hydroxypropyl(meth)acrylate, 4-hydroxybutyl(meth)acrylate, polyethyleneglycol mono(meth)acrylate, polypropyleneglycol mono(meth)acrylate, (meth)acrylamide, N-methylol acrylamide, N-bytoxymethyl acrylamide, styrene, α-methylstyrene, p-methylstyrene, p-chlorostyrene, (meth)acrylonitrile and glycidyl (meth)acrylate, each of which can be used alone or a combination of two or more of which can be used.

The percentage of the second monomer in the vinyl copolymer containing carboxyl group is preferably 60 to 85% by weight and more preferably 65 to 80% by weight.

In terms of the balance between separation and solder resistance, it is preferable to use vinyl copolymers containing carboxyl group that have different weight-average molecular weight. For the photosensitive resin, it is preferable to use (A1) 15 to 35% by weight of alkali-soluble polymer having a carboxyl group and having weight-average molecular weight of 40,000 to 90,000, on the basis of the total weight of photosensitive resin, and (A2) 15 to 35% by weight of alkali-soluble polymer having a carboxyl group and having weight-average molecular weight of 100,000 to 150,000, on the basis of the total weight of photosensitive resin.

As component (B), well-known addition polymerizable monomer can be used. Examples include polyoxyalkylene mono(meth)acrylate, polyoxyalkylene di(meth)acrylate, bisphenol A alkyleneoxide denatured diacrylate, and poly (meth)acrylate obtained by denaturing polyhydric alcohol with ethylene oxide, one of which or a combination of two or more of which can be used. On the basis of the total weight of photosensitive resin, the content is preferably 15 to 60% by weight and more preferably 20 to 50% by weight. In order to harden the photosensitive resin layer sufficiently and keep strength as resist, the above content is preferably not less than 15% by weight. In addition, in order to prevent cracks from occurring after hardening, the total content of the above addition polymerizable monomer is preferably not more than 60% by weight.

Addition polymerizable double-bond concentration $D_T$ per 100 g of photosensitive resin is preferably not less than 0.07 in terms of resin mask adhesiveness and not more than 0.12 in terms of resin mask resolution, more preferably 0.08 to 0.11. In other words, it is preferable to form a resin mask layer by using a dry film resist that comprises a photosensitive resin whose addition polymerizable double-bond concentration $D_T$ is 0.07 to 0.12 per 100 g of photosensitive resin, a carrier film on which the photosensitive resin is laminated and a cover film that is provided on the surface of this photosensitive resin layer.

The above-mentioned double-bond concentration $D_T$ can be obtained by the following formulas.

1. When $W_1$ of addition polymerizable monomer [1] is contained in a photosensitive resin, double-bond concentration $D_1$ is calculated as follows.

$$D_1=(d_1/M_1) \quad \text{(Formula: a)}$$

$D_1$: Double-bond concentration of addition polymerizable monomer [1]
$d_1$: Number of addition polymerizable double bond in one molecule of addition polymerizable monomer [1]
$M_1$: Number average molecular weight of addition polymerizable monomer [1]

For example, double-bond concentration D of triethoxy methylol propane triacrylate can be figured out as follows.

$$D=(3/428)=0.00701$$

2. As for addition polymerizable monomers [2], [3], . . . , double-bond concentrations $D_2$, $D_3$, . . . are respectively calculated in the same manner as Formula: a. Using Formula: b, double-bond concentration per 100 g of photosensitive resin $D_T$ is figured out.

$$D_T=(D_1 \times W_1 + D_2 \times W_2 + D_3 \times W_3 \ldots) \times (100/W_T) \quad \text{(formula: b)}$$

$D_T$: Double bond concentration per 100 g of photosensitive resin
$W_1$: Weight of addition polymerizable monomer [1] in photosensitive resin (g)
$W_2$: Weight of addition polymerizable monomer [2] in photosensitive resin (g)
$W_3$: Weight of addition polymerizable monomer [3] in photosensitive resin (g)
•
•
•
$W_T$: Total weight of photosensitive resin (g)

As component (C) can be used well-known photopolymerization initiators such as benzophenone derivatives, benzyl ketal derivatives, thioxanthone derivatives and aryl imidazole derivatives. In terms of adhesiveness, 2-(o-chlorophenyl)-4,5-diphenylimidazole dimer is preferable. On the basis of the total weight of photosensitive resin, the content of photopolymerization initiator is preferably 0.01 to 20% by weight, and more preferably 1 to 10% by weight. In other words, the content of not less than 0.01% by weight is preferable to obtain enough sensitivity, and the content of not more than 20% by weight is preferable to harden the bottom part of a photosensitive resin layer sufficiently.

In terms of separation of a resin mask layer, the photosensitive resin in the present invention preferably contains, as component (D), polypropylene oxide having weight-average molecular weight of 1,000 to 3,000. Further, in terms of separation and resin mask resolution, it is particularly preferable to contain polypropylene oxide having weight-average molecular weight of 1,500 to 2,500. From the viewpoint of separation and resolution, it is preferable to contain 7 to 30% by weight of component (D) on the basis of the total weight of photosensitive resin.

First, in order to form a resin mask layer 4, using the above dry film resist, a cover film is stripped off from the dry film resist, and a photosensitive resin layer is bonded by pressure to the above-mentioned substrate 1. A mask is lapped over the surface of the photosensitive resin layer except for the portion of electrodes 2. Next, the portion of electrodes 2 is exposed, and developed with $Na_2CO_3$ solution etc. after stripping off the carrier film. This makes it possible to form a resin mask layer 4 having opening parts in the portion of electrodes 2. The internal diameter and pitch of an opening part depend on size and number of the electrodes 2 to be used, and therefore they are not specifically limited.

The thickness of the resin mask layer 4 can be larger or smaller than the height of a solder bump 6 to be formed. Specifically, the height of a solder bump 6 is 0.05 to 3 times, preferably 0.1 to 1.5 times as large as the total thickness that is the sum of thickness of a resin mask layer 4 plus thickness of a solder resist film 3. Normally, a resin mask layer 4 is about 10 to 300 μm thick, preferably about 30 to 150 μm thick.

As a solder precipitating composition 5 can be cited (a) solder precipitating composition containing tin powder and metal salt such as lead, copper and silver, or (b) solder precipitating composition containing tin powder and a complex of at least one selected from silver ions and copper ions, and at least one selected from aryl phosphines, alkyl phosphines and azoles. A mixture of the metal salt in the above (a) and the complex in the above (b) can be used. In the present invention, it is in particular preferable to use a lead-free solder precipitating composition that contains no lead. Also, it should be interpreted that the term "tin powder" includes, for example, tin-silver alloy powder containing silver, and tin-copper alloy powder containing copper, as well as metallic tin powder. Examples of the metal salt include salts of organic carboxylic acid or organic sulfonic acid.

The ratio of the above-mentioned tin powder to the above-mentioned metal salt or complex in the composition, i.e., (Weight of tin powder):(Weight of metal salt or complex), is about 99:1 to 50:50, preferably about 97:3 to 60:40. In the present invention, the metal complex is more preferably used than the metal salt.

Besides the above-mentioned components, flux component and solvent can be added into the above-mentioned composition. As a flux component, similar ones which are used for tin-lead, tin-silver, and tin-copper solder material are usable. As a solvent, any one is usable which can dissolve other components in a composition and adjust viscosity and concentration.

The above-mentioned solder composition 5 may be applied on the entire surface of the substrate 1, or a method of application with a metal mask and a squeegee (screen-printing) may be employed. The application quantity of the solder composition 5 can be properly determined, depending on the size and height of a solder bump 6 to be formed. Specifically speaking, the application quantity may be determined so as to obtain a desirable quantity of solder alloy to be precipitated.

After application, solder alloy is precipitated through heating at a predetermined temperature. At this time, since solder alloy to be produced has high wettability with copper that constitutes electrodes 2, it selectively attaches to the surface of the electrodes 2 and forms solder bumps 6. Especially when using the above-mentioned complex, there is a tendency to improve the selectivity to the surface of the electrodes 2. Therefore, after heating, the substrate 1 is allowed to be cooled, and the remaining alloy component and the like are washed away with solvent, thereby preventing solder alloy from remaining anywhere except for the electrodes 2.

Taking into consideration the thermal resistance of circuit substrates and the like, heating temperature is 200° C. or higher, preferably about 200 to 260° C. Heating time may be determined depending on the constitution of the composition etc. and it is usually about 30 seconds to 10 minutes, preferably about 1 to 5 minutes. Precipitation process of solder alloy (application and heating process) may be performed, divided into two or more times. After heating, the substrate 1 is allowed to be cooled, and the remaining alloy component and the like are washed away with solvent so that solder alloy cannot remain anywhere except for the electrodes 2.

After heating process, the resin mask layer 4 is separated and removed. In the present invention, at least one solvent selected from glycol ethers and aminoalcohols is used as a remover. Examples of glycol ethers include monoethers of glycol, diethers of glycol and esters of glycol monoether. Among these, monoethers of glycol are preferable, and in particular, monoethers of diethylene glycol (carbitols) are preferable.

Examples of the monoethers of glycol include ethylene glycol monomethyl ether (methyl cellosolve), ethylene glycol monoethyl ether (cellosolve), ethylene glycol monoisopropyl ether (isopropyl cellosolve), ethylene glycol mono-n-butyl ether (butyl cellosolve), ethylene glycol monoisobutyl ether (isobutyl cellosolve), ethylene glycol mono-tert-butyl ether (tert-butyl cellosolve), ethylene glycol monohexyl ether (hexyl cellosolve), diethylene glycol monomethyl ether (methyl carbitol), diethylene glycol monoethyl ether (carbitol), diethylene glycol monoisopropyl ether (isopropyl carbitol), diethylene glycol mono-n-butyl ether (butyl carbitol), diethylene glycol monoisobutyl ether (isobutyl carbitol), diethylene glycol mono-tert-butyl ether (tert-butyl carbitol), diethylene glycol monohexyl ether (hexyl carbitol), propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, 1,3-butylene glycol monomethyl ether (methoxybutanol) and 3-methyl-methoxybutanol (solfit).

Examples of the diethers of glycol include ethylene glycol dimethyl ether, diethylene glycol dimethyl ether, diethylene glycol diethyl ether, diethylene glycol di-n-butyl ether, triethylene glycol dimethyl ether, polyethylene glycol dimethyl ether and dipropylene glycol dimethyl ether.

Examples of the esters of glycol monoether include ethylene glycol monoethyl ether acetate (cellosolve acetate), ethylene glycol monobutyl ether acetate (butylcellosolve acetate), diethylene glycol monoethyl ether acetate (carbitol acetate), diethylene glycol monobutyl ether acetate (butylcarbitol acetate), propylene glycol monomethyl ether acetate and 3-methyl-3-methoxybutyl acetate (solfit acetate).

Examples of aminoalcohols (alkanolamines) include monoethanolamine (2-ethanolamine, 2-aminoethanol), diethanolamine, triethanolamine, monopropanolamine, dipropanolamine, tripropanolamine, monoisopropanolamine, diisopropanolamine, triisopropanolamine, monobutanolamine, dibutanolamine, neopentanolamine, N,N-dimethylethanolamine, N,N-diethylethanolamine, N,N-dimethylpropanolamine, N,N-diethylpropanolamine, N-(β-aminoethyl) ethanolamine, N-methylethanolamine, N-methyldiethanolamine, N-n-butylethanolamine, N-tert-butylethanolamine, N-tert-butyldiethanolamine, N,N-di-n-butylethanolamine and N-ethylethanolamine. Among these, ethanolamines are preferably used, and in particular monoethanolamine is preferable.

Particularly, in the method of the present invention, it is preferable to use at least one solvent selected from glycol ethers as a remover. This is because glycol ethers cause less damage to solder resist and solder on a substrate than aminoalcohols.

These solvents may be used alone, or in combination with other solvents such as water and alcohol. When mixed with other solvents, at least one solvent selected from glycol ethers and aminoalcohols may be not less than 10% by weight, preferably not less than 15% by weight to the total solvent amount.

The resin mask layer 4 is removed by exposing to the above-mentioned solvent the resin mask layer 4 on the surface of the substrate 1 where solder bumps 6 are formed through heating process. Exposing methods include, for example, soaking method, i.e., soaking the substrate 1 in the above-mentioned solvent, and spraying method, i.e., spraying the solvent on the substrate 1. The temperature of the solvent to be used is not specifically limited, but normally it may be properly determined within the range of 1 to 80° C., preferably 15 to 65° C. The time to be taken to remove the resin mask layer 4, in other words, the time to expose the resin mask layer 4 to the above solvent is about 30 seconds to 2 hours, preferably 50 seconds to 45 minutes. Generally, the higher temperature this process undergoes, the shorter time it takes.

Ultrasonic cleaning may be carried out, soaking the substrate 1 in the above solvent. This makes it possible to further shorten the processing time.

The solder bumps 6 in the present invention are normally 40 to 100 μm tall. According to the method of the present invention, these solder bumps 6 can be arranged at narrow pitches and adapted to even about 80 μm pitch.

This embodiment is described, citing the substrate that has electrodes 2 (wiring layer) prepared on one surface only. However, the method of the present invention is also applicable to the substrate that has electrodes (wiring layer) prepared on both surfaces and the substrate that has electrodes (wiring layer) prepared in the interior as well as on one surface or both surfaces. Specifically, the method of the present invention is applicable to bump formation by pre-coating to the surface of electrodes (conductor patterns) of multi chip modules or various packages, presoldering to a via-on-pad of build-up process substrate, and fine pitch bump formation, as well as solder precoating for mounting TCP (tape carrier package), and high-volume precoating for mounting QFP (quad flat package). The insulation layer in the present invention includes not only a substrate but also a solder resist film.

Examples of the present invention will be described below. It is understood, however, that the examples are for the purpose of illustration and the invention is not to be regarded as limited to any of the specific materials or condition therein.

EXAMPLES

Example 1

(Substrate)

The substrate used here was covered with a 10 μm thick solder resist film, and had pads (electroless nickel gold plated electrodes) exposed from opening parts (diameter: 80 μm) that were formed in the solder resist film. The pads were formed at 150 μm pitches on the substrate.

(Preparation of Dry Film Resist (a))

The following ingredients were mixed to prepare a photosensitive resin solution.

| | |
|---|---|
| Methyl ethyl ketone solution of a terpolymer of 65% by weight of methyl methacrylate, 25% by weight of methacrylic acid and 10% by weight of butyl acrylate (concentration of solid content: 34%, weight-average molecular weight: 80,000, acid equivalent: 340) | 65 g |
| Methyl ethyl ketone solution of a terpolymer of 65% by weight of methyl methacrylate, 25% by weight of methacrylic acid and 10% by weight of butyl acrylate (concentration of solid content: 34%, weight-average molecular weight: 120,000, acid equivalent: 340) | 88 g |
| Triethoxy methylol propane acrylate | 10 g |
| Dimethacrylate of glycol in which average 3 mole of ethylene oxide was respectively added to the both ends of polypropylene glycol wherein average 8 mole of propylene oxide was added | 17 g |
| p-nonylphenoxy heptaethoxy dipropoxy acrylate | 5 g |
| 2-(o-chlorophenyl)-4,5-diphenyl imidazole dimer | 3 g |
| 4,4'-bis (diethylamino) benzophenone | 0.14 g |
| Diamond green | 0.04 g |
| Leuco crystal violet | 0.5 g |
| Polypropylene glycol (UNIOL D-2000 by NOF Corp.) | 10 g |
| p-toluenesulfonamide | 5 g |
| Methyl ethyl ketone | 10 g |

(Addition of polymerizable double-bond concentration per 100 g of photosensitive resin $D_T$: 0.106)

Next, a dry film resist (a) was prepared in the following manner.

The above-mentioned photosensitive resin was applied on a 19 μm thick polyethylene terephthalate film with a bar-coater to obtain a laminated body of a carrier film and a photosensitive resin. The laminated body was dried at 90° C. for three minutes. The photosensitive resin was applied so that the photosensitive resin was 38 μm thick after drying. A cover film was laminated on the photosensitive resin surface opposite to the carrier film, thereby obtaining a dry film resist (a).

(Preparation of Resin Mask Layer)

The cover film was separated from the above dry film resist (a), and the photosensitive resin layer was bonded by pressure on the substrate surface. A mask was disposed on the surface of the photosensitive resin layer. Then, after each pad and its surroundings were exposed, the carrier film was removed. Through development with $Na_2CO_3$ aqueous solution, a 38 μm thick resin mask layer having 130 μm internal diameter opening parts at 150 μm pitches in pad portions was formed.

(Solder Precipitating Composition)

The following ingredients were kneaded to obtain a solder composition.

| | |
|---|---|
| Sn/Pb alloy powder (Sn/Pb = 70/30, 10 μm in average particle diameter) | 75% by weight |
| Lead Naphthenate | 10% by weight |
| Flux | 15% by weight |

The flux used here was obtained by mixing the following ingredients and then melting while heating at 120° C., following by cooling at room temperature.

| | |
|---|---|
| Rosin resin | 70% by weight |
| Hexyl carbitol (solvent) | 25% by weight |
| Hardened castor oil (thixotropy agent) | 5% by weight |

(Solder Precipitation Process)

By screen printing, the solder composition obtained as above was filled in each opening part on the above substrate. Through heating at 240° C. or higher for one minute, solder bumps were formed on individual pads.

(Preparation of Remover for Resin Mask Layer)

17 ml of 2-ethanolamine solution (by Mitsubishi Gas Chemical Company, Inc.) and 83 ml of distilled water were mixed at room temperature to prepare 100 ml of remover.

(Separation Process of Resin Mask Layer)

100 ml of remover prepared as above was added in a 200 ml beaker and heated to about 40° C. with a hot plate. Subsequently, the above substrate having solder bumps formed was soaked in the remover for 1 to 2 minutes to remove dams.

Example 2

IL of butyl carbitol that was heated to about 60° C. was added in an ultrasonic cleaning equipment. The substrate having a resin mask layer and solder bumps formed in the same manner as in Example 1 was soaked therein and the resin mask layer was removed through ultrasonic cleaning for 3 to 5 minutes.

Example 3

The substrate having a resin mask layer and solder bumps formed in the same manner as in Example 1 was soaked in the remover of 20° C. obtained in Example 1 for 30 minutes to remove the resin mask layer.

Comparative Example 1

The substrate having a resin mask layer and solder bumps formed in the same manner as in Example 1 was soaked in NaOH aqueous solution of 40° C. for 2 minutes to remove the resin mask layer.

Comparative Example 2

The substrate having a resin mask layer and solder bumps formed in the same manner as in Example 1 was soaked in NaOH aqueous solution of 20° C. for 30 minutes to remove the resin mask layer.

Solder bumps obtained in the examples and comparative examples were evaluated as follows.

(Evaluation Method)

1. Check on Solder Resist Appearance and Resin Mask Layer Residue

Using a microscope (VH-6300 by Keyence corp.), whether solder resist color changes before and after separation process of resin mask layer or not, and whether a resin mask layer remains on the substrate resist after separation process of resin mask layer or not were checked. Evaluation standard is as follows.

Change of solder resist color: o=Not found, X=Found
Residue of resin mask layer: o=Not found, X=Found 2. Appearance Check for Solder Bump Using a microscope (VH-6300 by Keyence corp.), shape and gloss of solder bumps after separation process of dams were checked.

Evaluation standard: o=Hemispheric bump having smooth surface and gloss of solder Δ=Hemispheric bump having irregular surface or no gloss of solder X=Bump having irregular shape and no gloss of solder 3. Solder Connecting Property of Solder Bump After separation process of dams, flux was applied on solder bumps, and solder balls were placed thereon. After heating at 240° C. or higher for one minute, whether solder balls were connected with solder bumps or not was checked, using a microscope. Evaluation standard: ○=Good connection, X=Poor connection The results were presented in Table 1.

TABLE 1

|  | Change of color in solder resist | Resin mask layer residue | Solder bump appearance | Solder connecting property |
|---|---|---|---|---|
| Example 1 | ○ | ○ | ○ | ○ |
| Example 2 | ○ | ○ | ○ | ○ |
| Example 3 | ○ | ○ | ○ | ○ |
| Comparative Example 1 | X | X | X | X |
| Comparative Example 2 | X | X | Δ | X |

As apparent from Table 1, compared to Comparative Examples where a strong alkali solution was used as remover, Examples show less damage to solder resist and solder bumps and no loss of solder connecting property.

Although the present invention has been described in relation to particular embodiments thereof, many other variations and modifications and other uses will become apparent to those skilled in the art. Therefore, the present invention is to be limited not by the specific disclosure therein, but only by the appended claims.

What is claimed is:

1. A method for removing a resin mask layer, comprising the steps of:
    forming a resin mask layer around electrodes that are exposed from opening of an insulation layer formed on a substrate surface, by using a dry film resist;
    applying a solder precipitating composition on the substrate;
    precipitating solder on the surface of the electrodes while heating this solder precipitating composition; and
    removing the resin mask layer,
    wherein at least a glycol ether is used to remove the resin mask layer after heating process.

2. A method for removing a resin mask layer, comprising the steps of:
    forming a resin mask layer around electrodes that are exposed from opening parts of an insulation layer formed on a substrate surface, by using a dry film resist;
    applying a solder precipitating composition on the substrate;
    precipitating solder on the surface of the electrodes while heating this solder precipitating composition; and
    removing the resin mask layer,
    wherein the dry film resist is a photosensitive resin laminated body comprising a carrier film and a photosensitive resin layer that are laminated on the carrier film;
    wherein the photosensitive resin contains
    (A1) 15 to 35% by weight of alkali-soluble polymer having a carboxyl group and having weight-average molecular weight of 40,000 to 90.000.
    (A2) 15 to 35% by weight of alkali-soluble polymer having a carboxyl group and having weight-average molecular weight of 100.000 to 150.000.
    (B) 15 to 60% by weight of addition polymerizable monomer;
    (C) 0.01 to 10% by weight of photopolymerizable initiator, and
    (D) 7 to 30% by weight of polypropylene oxide having weight-average molecular weight of 1. 000 to 3,000: and
    wherein at least one selected from glycol ethers and aminoalcohols is used to remove the resin mask layer after heating process.

3. The method for removing a resin mask layer according to claim 2, wherein the heating process is performed at a temperature of 200° C. or higher.

4. The method for removing a resin mask layer according to claim 2, wherein the substrate wherein the resin mask layer is formed is soaked in a remover containing at least one selected from the glycol ethers and the aminoalcohols to remove the resin mask layer.

5. The method for removing a resin mask layer according to claim 2, wherein the substrate wherein the resin mask layer is formed is soaked in a remover containing at least one selected from the glycol ethers and the aminoalcohols, and ultrasonic cleaning is carried out.

6. The method for removing a resin mask layer according to claim 2, wherein the glycol ethers are monoethers of glycol and the aminoalcohols are ethanolamines.

7. The method for removing a resin mask layer according to claim 2, wherein the dry film resist is a photosensitive resin laminated body comprising a photosensitive resin layer and a cover film that are laminated in this order on a carrier film.

8. The method for removing a resin mask layer according to claim 2, wherein a resin mask layer is formed by using a dry film resist that comprises a photosensitive resin whose addition polymerizable double-bond concentration $D_T$ is 0.07 to 0.12 per 100 g of photosensitive resin, a carrier film on which the photosensitive resin is laminated, and a cover film that is provided on the surface of this photosensitive resin layer.

9. The method for removing a resin mask layer according to claim 7, wherein the step of forming a resin mask layer comprises the steps of:
    bonding a photosensitive resin layer by pressure on the substrate surface after stripping off a cover film from the dry film resist;
    lapping a mask over the surface of the photosensitive resin layer except for the portion of electrodes;
    exposing the portion of electrodes; and
    forming a resin mask layer having opening parts in the portion of electrodes through development with a developer after stripping off the carrier film.

10. A method for manufacturing a solder bumped substrate, comprising the steps of:
    forming a resin mask layer around electrodes on a substrate surface by using a dry film resist;
    applying a solder precipitating composition on the substrate;
    precipitating solder bumps on the surface of the electrodes while heating this solder precipitating composition; and
    removing the resin mask layer after heating process wherein the dry film resist is a photosensitive resin laminated body comprising a carrier film and a photosensitive resin layer that are laminated on the carrier film;

wherein the photosensitive resin contains
(A1) 15 to 35% by weight of alkali-soluble polymer having a carboxyl group and having weight-average molecular weight of 40,000 to 90.000,
(A2) 15 to 35% by weight of alkali-soluble polymer having a carboxvl grouc and having weight-average molecular weight of 100.000 to 150.000,
(B) 15 to 60% by weight of addition polymerizable monomer;
(C) 0.01 to 10% by weight of photopolymerization initiator, and
(D) 7 to 30% by weight of polypropylene oxide having weight-average molecular of 1,000 to 3,000; and
wherein at least one selected from glycol ethers and aminoalcohols is used to remove the resin mask layer after heating process.

11. The method for manufacturing a solder bumped substrate according to claim 10, wherein the substrate is composed of at least one wiring layer and at least two insulation layers, and at least one of the insulation layers has higher glass transition point than a temperature at which the heating process is performed.

12. The method for manufacturing a solder bumped substrate according to claim 10, wherein the substrate wherein the resin mask layer is formed is soaked in a remover containing at least one selected from the glycol ethers and the aminoalcohols to remove the resin mask layer.

13. The method for manufacturing a solder bumped substrate according to claim 10, wherein the dry film resist is a photosensitive resin laminated body comprising a photosensitive resin layer and a cover film that are laminated in this order on a carrier film.

14. The method for manufacturing a solder bumped substrate according to claim 11, wherein the heating process is performed at a temperature of 200° C. or higher.

* * * * *